(12) United States Patent
Chung et al.

(10) Patent No.: US 7,560,863 B2
(45) Date of Patent: Jul. 14, 2009

(54) ORGANIC ELECTROLUMINESCENT DISPLAY DEVICE INCLUDING A SHIELDING PATTERN TO REDUCE RESISTANCE

(75) Inventors: In-Jae Chung, Gyeonggido (KR); Ki-Yong Kim, Gyeonggido (KR); Sung-Joon Bae, Gyeonggido (KR); Jae-Yong Park, Gyeonggido (KR)

(73) Assignee: LG Display Co., Ltd., Seoul (KR)

( * ) Notice: Subject to any disclaimer, the term of this patent is extended or adjusted under 35 U.S.C. 154(b) by 484 days.

(21) Appl. No.: 11/107,875

(22) Filed: Apr. 18, 2005

(65) Prior Publication Data

US 2005/0236956 A1 Oct. 27, 2005

(30) Foreign Application Priority Data

Apr. 19, 2004 (KR) .................. 10-2004-0026571

(51) Int. Cl.
*H01J 61/35* (2006.01)
(52) U.S. Cl. .................. 313/506; 313/492; 313/496; 313/504
(58) Field of Classification Search .................. 313/498, 313/501–506, 272; 257/40; 428/690, 917
See application file for complete search history.

(56) References Cited

U.S. PATENT DOCUMENTS

| | | | |
|---|---|---|---|
| 6,005,344 A | | 12/1999 | Fleming |
| 6,344,714 B1* | 2/2002 | Su et al. ................. 313/582 |
| 6,768,534 B2* | 7/2004 | Iwase et al. ............. 349/153 |
| 6,830,855 B2* | 12/2004 | Kiguchi et al. ............ 430/7 |
| 2003/0201445 A1* | 10/2003 | Park et al. ................. 257/79 |
| 2003/0205970 A1* | 11/2003 | Park et al. ............... 313/506 |
| 2004/0036411 A1* | 2/2004 | Kim et al. ............... 313/506 |

FOREIGN PATENT DOCUMENTS

| | | | |
|---|---|---|---|
| CN | 1363200 | | 8/2002 |
| CN | 1477912 | | 2/2004 |
| EP | 1321821 | * | 6/2003 |
| WO | WO0144865 | * | 6/2001 |

* cited by examiner

*Primary Examiner*—Joseph L Williams
*Assistant Examiner*—Fatima N Farokhrooz
(74) *Attorney, Agent, or Firm*—McKenna Long & Aldridge LLP

(57) ABSTRACT

An electroluminescent display device includes first and second substrates facing each other and having a pixel region and a non-pixel region; a thin film transistor and an array layer on an inner surface of the first substrate; a first electrode on an inner surface of the second substrate; a buffer layer on the first electrode in the non-pixel region; a shielding pattern on the buffer layer; a separator on the shielding pattern; an emitting layer on the first electrode in the pixel region; a second electrode on the emitting layer; and a connection electrode between the first and second substrates.

20 Claims, 15 Drawing Sheets

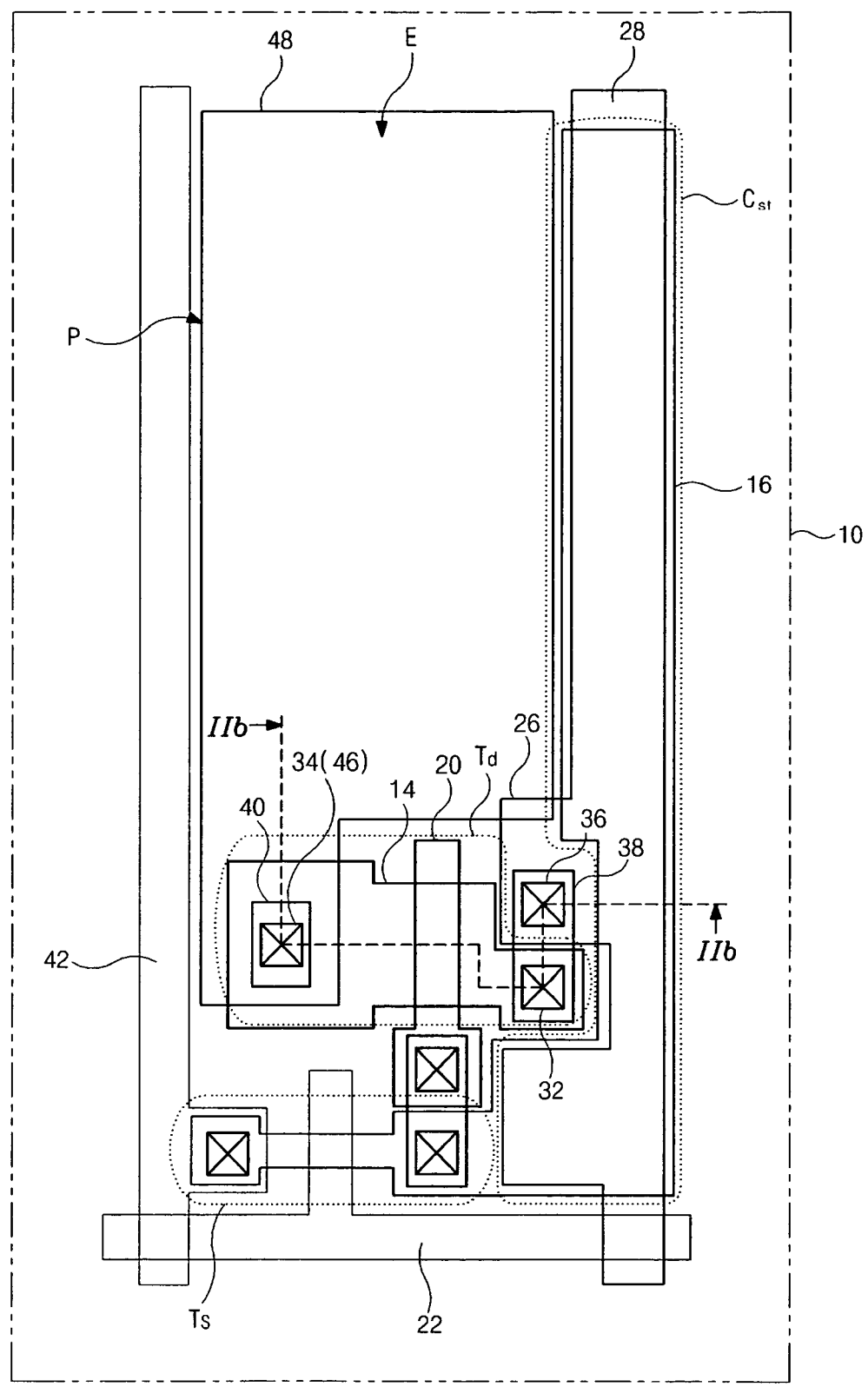

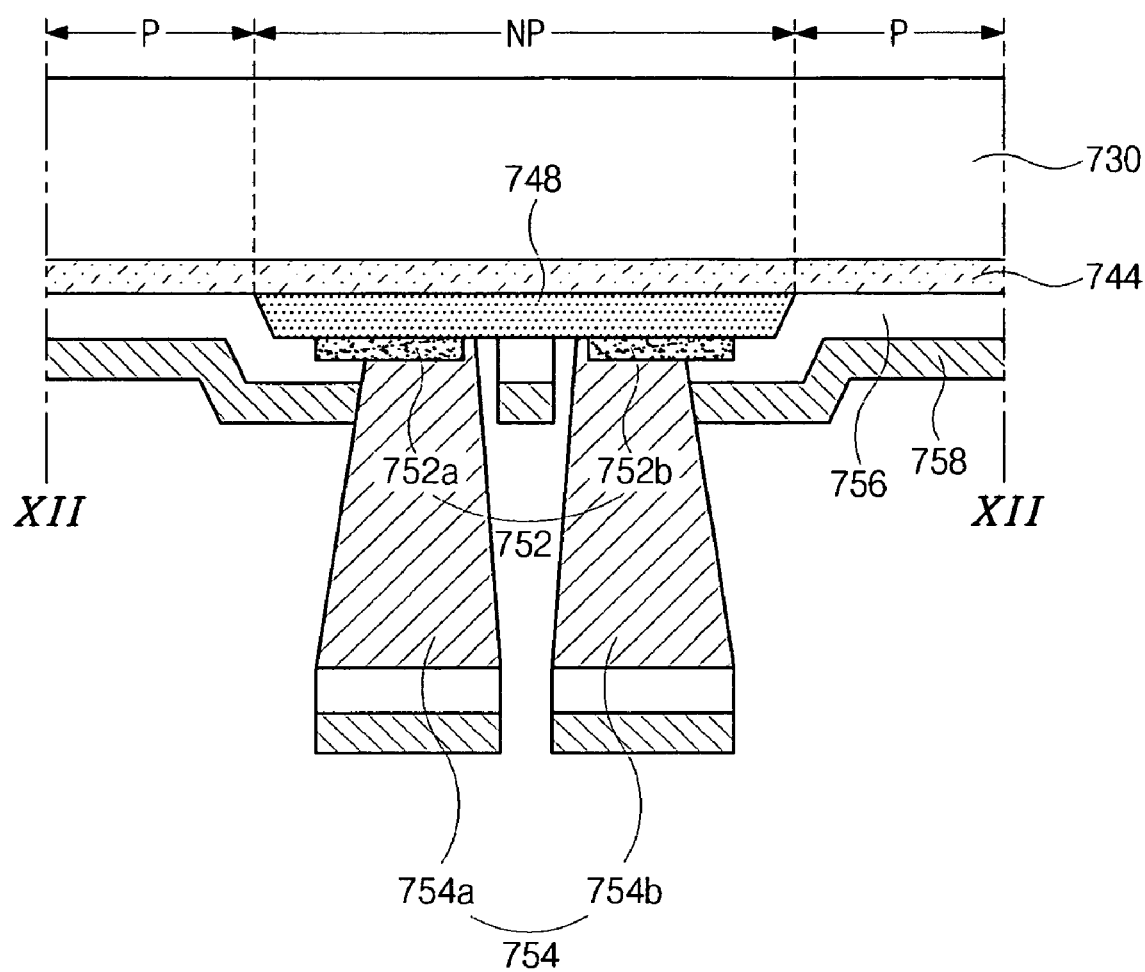

ORGANIC ELECTROLUMINESCENT DISPLAY DEVICE INCLUDING A SHIELDING PATTERN TO REDUCE RESISTANCE

The present invention claims the benefit of Korean Patent Application No. 2004-0026571 filed in Korea on Apr. 19, 2004, which is hereby incorporated by reference for all purposes as if fully set forth herein.

BACKGROUND OF THE INVENTION

1. Field of the Invention

The present invention relates to a display device and a method of fabricating a display device, and more particularly, to an organic electroluminescent display (OELD) device and a method of fabricating an OELD device.

2. Discussion of the Related Art

In the past, many display devices have employed cathode-ray tubes (CRTs) to display images. However, various types of flat panel displays, such as liquid crystal display (LCD) devices, plasma display panel (PDP) devices, field emission display (FED) devices, and electro-luminescent display (ELD) devices, are currently being developed as substitutes for the CRTs. Among these various types of flat panel displays, the PDP devices have advantages of large display size, but have disadvantages of heaviness and high power consumption. Similarly, the LCD devices have advantages of thin profile and low power consumption, but have disadvantages of small display size. However, the OELD devices are luminescent displays having advantages of fast response time, high brightness, and wide viewing angles.

FIG. 1 is a cross-sectional view of an OELD device according to the related art.

As illustrated in FIG. 1, an OELD device includes first and second substrates 10 and 60 facing each other and bonded together with a sealant 70. The first substrate 10 includes a thin film transistor T, an array layer AL and an organic emitting diode E including a first electrode 48 and an organic emitting layer 54 within a pixel region P, and a second electrode 56. The second substrate 60 has a recessed portion 62 filled with a desiccant 64 for blocking entry of outer moisture.

In FIG. 1, when the first electrode 48 is formed of a transparent material, light emitted from the organic emitting layer 54 is transmitted toward the first substrate 10. Thus, this OELD device is categorized as a bottom emission-type OELD device.

FIG. 2A is a plan view of a pixel region of an OELD device according to the related art, and FIG. 2B is a cross-sectional view, which shows a driving thin film transistor, taken along a line IIb-IIb of FIG. 2A.

As illustrated in FIG. 2A, in a pixel region P of a first substrate 10, a data line 42 and a gate line 22 crossing each other, a switching thin film transistor Ts, a driving thin film transistor Td, a power line 28 and an organic emitting diode E.

As illustrated in FIG. 2B, a buffer layer 12 is disposed on a first substrate 10. A semiconductor pattern 14 and a first capacitor electrode 16 is disposed on the buffer layer 12. A gate insulating layer 18 and a gate electrode 20 is disposed on the semiconductor pattern 14. The semiconductor pattern 14 includes an active region AR at a center portion, a drain region DR at a left portion and a source region at a right portion SR.

A first passivation layer 24 is disposed on the gate electrode 20. A power electrode 26 as a second capacitor electrode extended from the power line 28 is disposed on the first passivation layer 24 corresponding to the first capacitor electrode 16. The power electrode 26 as the second capacitor electrode and the first capacitor electrode 16 define a storage capacitor Cst.

A second passivation layer 30 is disposed on the power electrode 26. The first and second passivation layers 24 and 30 have first and second contact holes 32 and 34 exposing the source and drain regions SR and DR. Furthermore, the second passivation layer 30 have a third contact hole 36 exposing the power electrode 26.

Source and drain electrodes 38 and 40 are disposed on the second passivation layer 30. The source and drain electrodes 38 and 40 contact the source and drain regions SR and DR through the first and second contact hole 32 and 34, respectively. Furthermore, the source electrode 38 contacts the power electrode 26 through the third contact hole 36. A third passivation layer 44 is disposed on the source and drain electrodes 38 and 40 and has a fourth contact hole 46 exposing the drain electrode 40.

An organic emitting diode E including a first electrode 48, an organic emitting layer 54 and a second electrode 56 is disposed on the third passivation layer 44. The first electrode 48 is disposed on the third passivation layer 44 and contacts the drain electrode through the fourth contact hole 46. An inter layer 50 covers an end portion of the first electrode 48 and has an opening 51 exposing the first electrode 48. The organic emitting layer 54 covers the opening 51 and a portion of the inter layer 50. The second electrode 56 is disposed entirely on the substrate 10 having the organic emitting layer 54.

In the related art OELD device, because the switching and driving thin film transistors and the organic emitting diode are both formed on the first (lower) substrate, the production efficiency of the OELD device is reduced. For example, when one of the switching and driving thin film transistors and the organic emitting diode is determined to have a defect after fabrication, then the first (lower) substrate is considered unacceptable, and thus the production efficiency of the OELD device is reduced. Furthermore, when the OELD device is a bottom emission-type OELD device in which the first electrode of the organic emitting diode is formed of a transparent material, the aperture ratio of the OELD device is reduced and high resolution is difficult to achieve, because the switching and driving thin film transistors and metal lines block bottom emission of the light.

SUMMARY OF THE INVENTION

Accordingly, the present invention is directed to an OELD device and a method of fabricating an OELD device that substantially obviate one or more of problems due to limitations and disadvantages of the related art.

An advantage of the present invention is to provide an OELD device which can have an improved aperture ratio and high resolution.

Another advantage of the present invention is to provide a method of fabricating an OELD device which can have improved production efficiency.

Additional features and advantages of the invention will be set forth in the description which follows, and in part will be apparent from the description, or may be learned by practice of the invention. The advantages of the invention will be realized and attained by the structure particularly pointed out in the written description and claims hereof as well as the appended drawings.

To achieve these and other advantages and in accordance with the purpose of the present invention, as embodied and broadly described, an electroluminescent display device includes first and second substrates facing each other and having a pixel region and a non-pixel region; a thin film transistor and an array layer on an inner surface of the first substrate; a first electrode on an inner surface of the second substrate; a buffer layer on the first electrode in the non-pixel region; a shielding pattern on the buffer layer; a separator on the shielding pattern; an emitting layer on the first electrode in the pixel region; a second electrode on the emitting layer; and a connection electrode between the first and second substrates.

In another aspect, a method of fabricating a substrate for an electroluminescent display device includes forming a first electrode on a substrate having a pixel region and a non-pixel region; forming a buffer layer on the first electrode in the non-pixel region; forming a shielding pattern on the buffer layer; forming a separator on the shielding pattern; forming an emitting layer on the first electrode in the pixel region; and forming a second electrode on the emitting layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 2A is a plan view of a pixel region of an OELD device according to the related art;

FIG. 12 is a cross-sectional view taken along a line XII-XII of FIG. 11; and

DETAILED DESCRIPTION OF THE ILLUSTRATED EMBODIMENTS

Reference will now be made in detail to embodiments of the present invention, examples of which are illustrated in the accompanying drawings.

Figure 3:
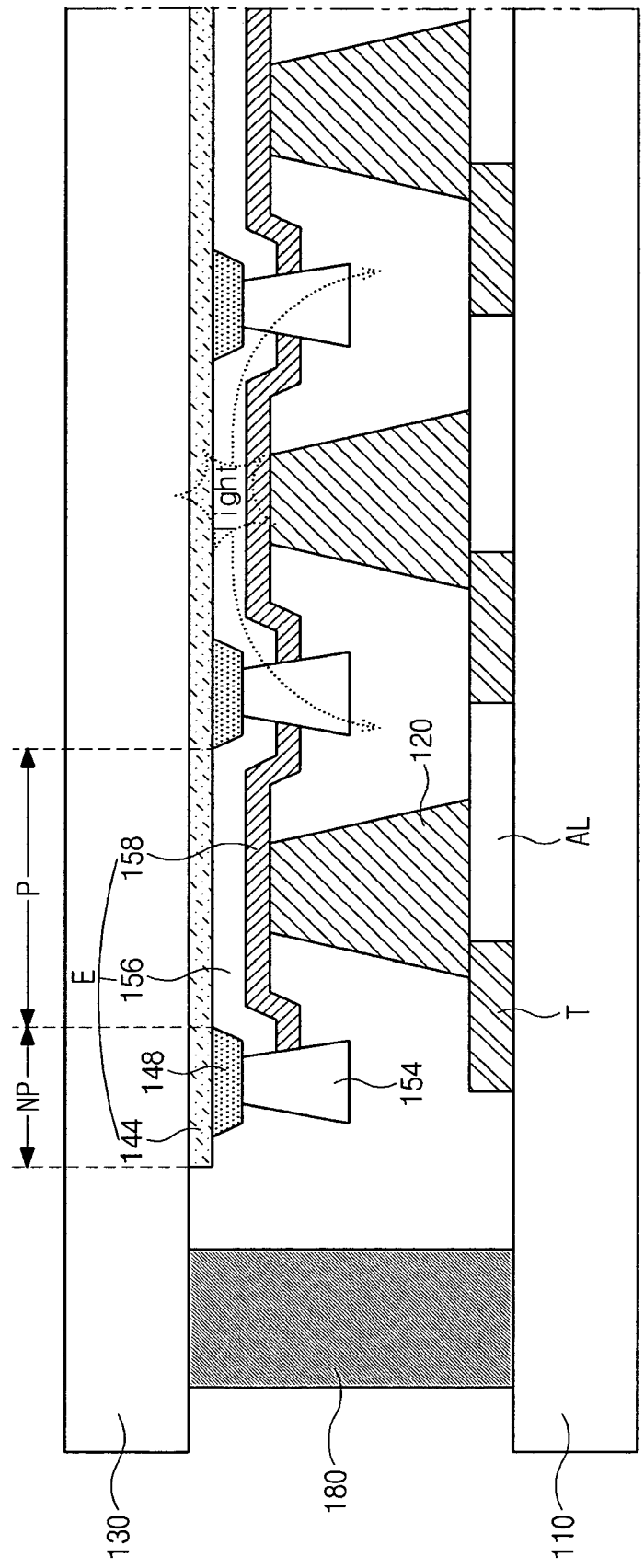
FIG. 3 is a cross sectional view of an OELD device according to a first embodiment of the present invention.

FIG. 3 is a cross-sectional view of an OELD device according to a first embodiment of the present invention.

As illustrated in FIG. 3, an OELD device includes first and second substrates 110 and 130 facing each other and bonded together by a sealant 180. In the OELD device, a pixel region P displaying images and a non-pixel region NP disposed between adjacent pixel regions NP are defined.

Figure 1:
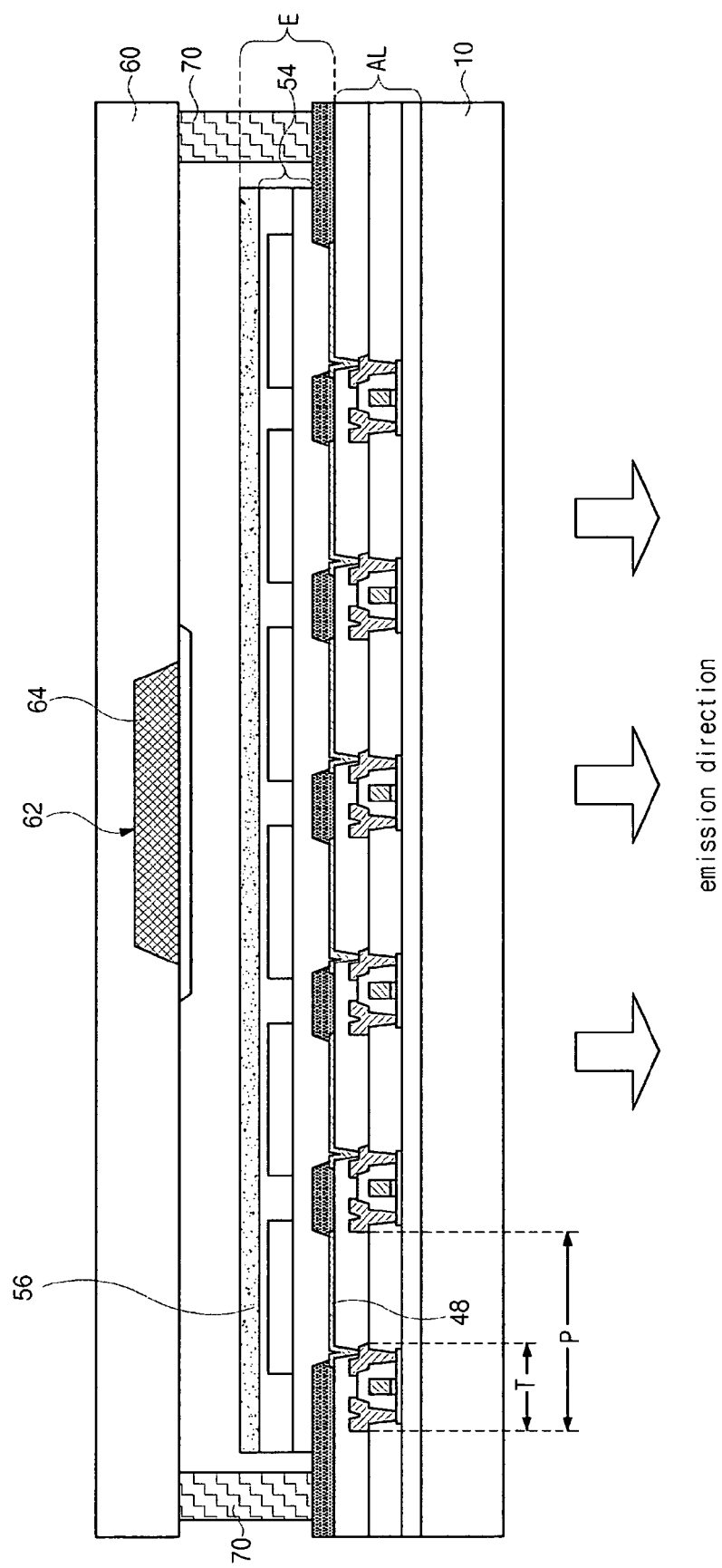
FIG. 1 is a cross-sectional view of an OELD device according to the related art.
Figure 2B:
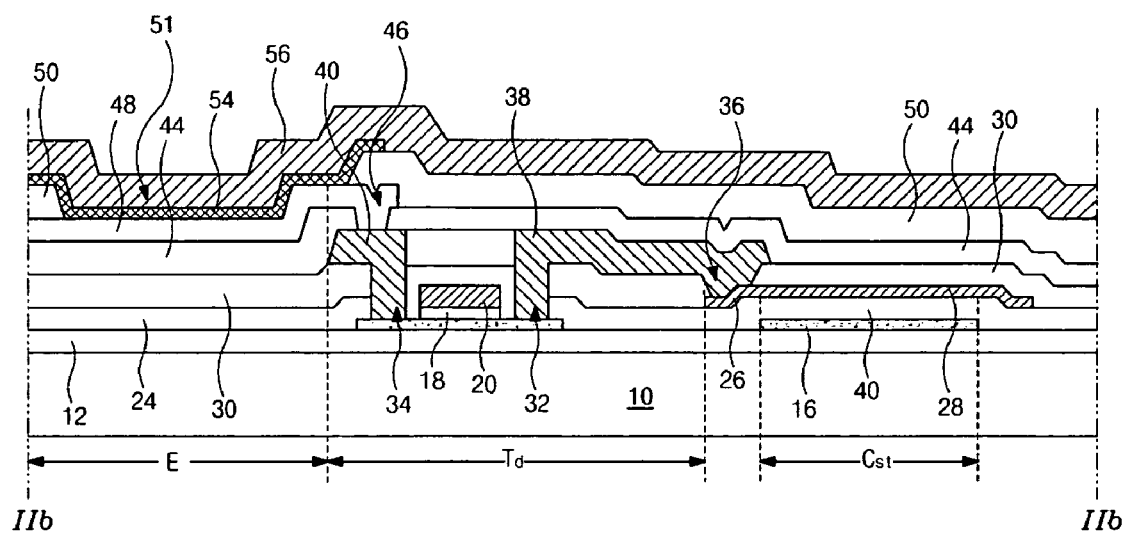
FIG. 2B is a cross-sectional view, which illustrates a driving thin film transistor, taken along a line IIb-IIb of FIG. 2A.

The first substrate 110 includes a thin film transistor T and an array layer AL disposed on the inner surface of the first substrate 110. The thin film transistor T is disposed in the pixel region P and connected to the array layer AL. Though not shown in drawings, the thin film transistor T may have a gate electrode, source and drain electrodes and a semiconductor pattern, as illustrated in FIG. 2A. The thin film transistor T may correspond to switching and driving thin film transistors. Though not shown in the drawings, the array layer AL may include conductive patterns such as gate and data lines defining the pixel region P and a power line.

The second substrate 130 includes an organic emitting diode E, a buffer layer 148 and a separator 154 on the inner surface of the second substrate 130. The organic emitting diode E includes a first electrode 144 on the second substrate 130, and an organic emitting layer 156 and a second electrode 158 on the first electrode 144 in the pixel region P. The first electrode 144 as an anode may be formed of a transparent conductive material such as indium-tin-oxide (ITO), indium-zinc-oxide (IZO) or the like. The second electrode 144 as a cathode may be formed of an opaque conductive material (i.e., metal) or the like. The organic emitting layer 156 may include an emitting material layer (EML), a hole injection layer (HIL) disposed between the first electrode 144 and the emitting material layer, and an electron injection layer (EIL) disposed between the second electrode 158 and the emitting material layer. When the first electrode 144 is formed of a transparent material, light emitted from the organic emitting layer 156 can travel toward the second substrate 130. Accordingly, the OELD device of FIG. 3 may be categorized as a top-emission type OELD device due to the light emission direction.

The buffer layer 148 and the separator 154 are disposed sequentially on the first electrode 144 in the non-pixel region NP. Since the separator 154 is disposed between adjacent pixel regions P, the separator 120 separates the organic emitting layer 156 and the second electrode 158. The buffer layer 148 acts as a means for preventing the first and second electrodes 144 and 158 from contacting each other.

A connection pattern 120 is disposed between the first and second substrates 110 and 130, and thus connects the thin film transistor T and the second electrode 158.

In the OELD device of the first embodiment, the thin film transistor T and the organic emitting diode E are respectively formed on the different substrates 110 and 130. Therefore, the production efficiency of the OELD device can increase. Further, in the top emission type OELD, the light emitted from the organic emitting layer 156 can travel toward the second substrate 130 facing the first substrate 110, where the thin film transistor T and metal lines blocking light emission are disposed. Therefore, the aperture ratio of the OELD device can increase, thereby achieving a high resolution.

As above explained, the light emitted from the organic emitting layer 156 travels toward the second substrate 130. However, portions of the emitted light may travel toward the first substrate 110 through the transparent separator 154, as shown with a dashed arrow of FIG. 3. This abnormal light traveling toward the first substrate 110 may cause a current leakage of the thin film transistor T when amorphous silicon is used for the semiconductor pattern of the thin film transistor T.

Next, a second embodiment of the present invention will be described as an improvement of the first embodiment as shown in FIG. 3.

Figure 4:
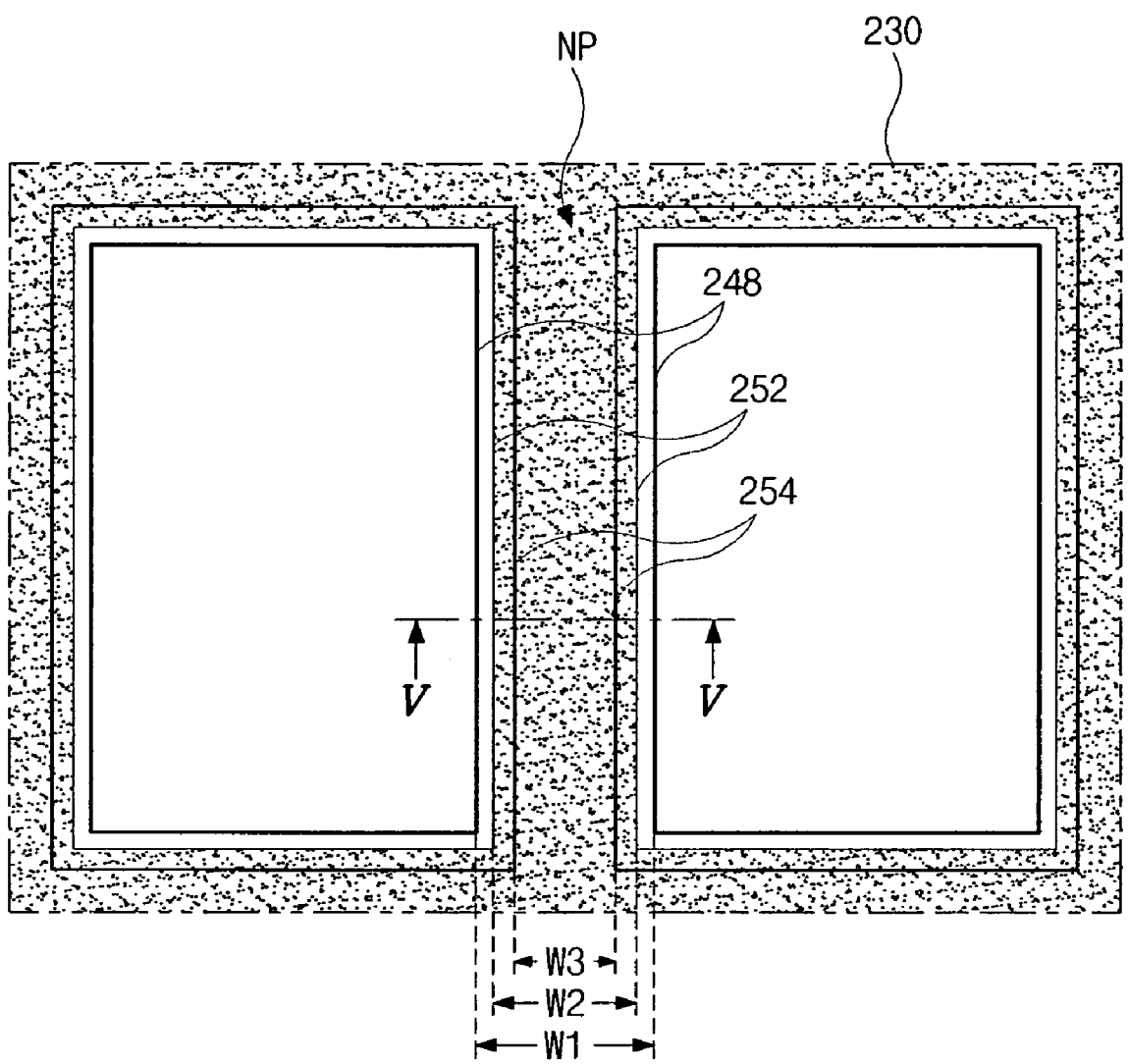
FIG. 4 is a plan view of an OELD device according to a second embodiment of the present invention.
Figure 5:
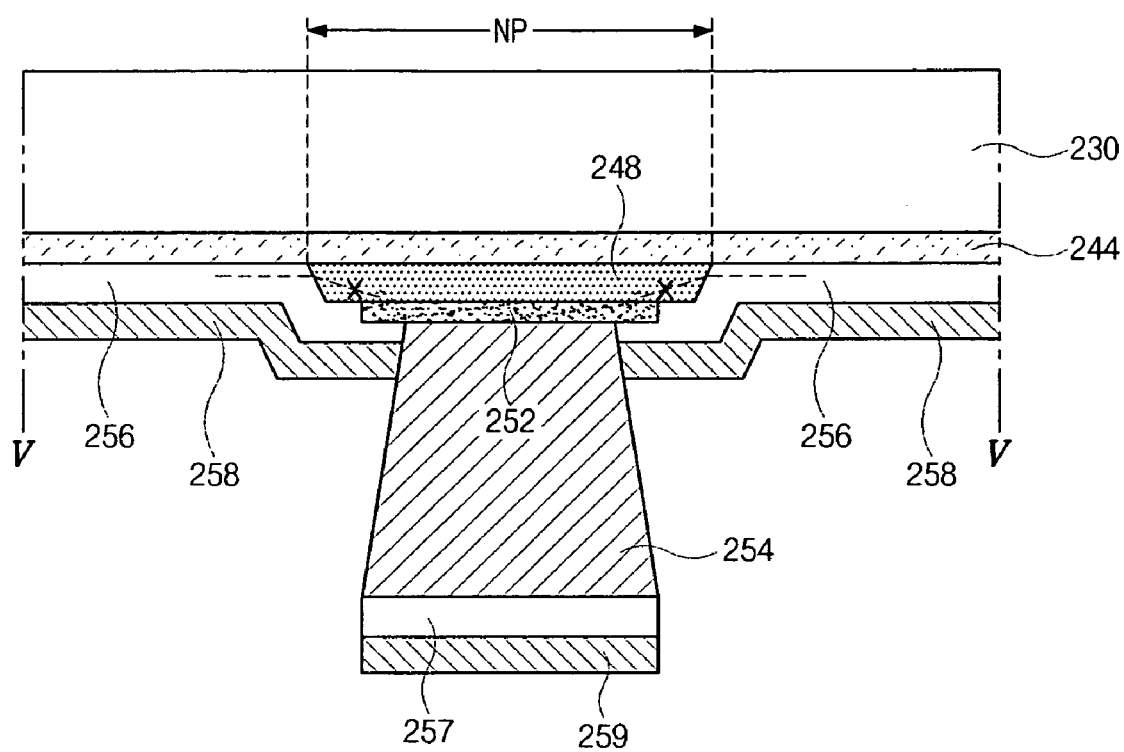
FIG. 5 is a cross-sectional view taken along a line V-V of FIG. 4.

FIG. 4 is a plan view of an OELD device according to a second embodiment of the present invention, and FIG. 5 is a cross-sectional view taken along a line V-V of FIG. 4. Detailed explanation of the similar parts to the first embodiment will be omitted.

As illustrated in FIGS. 4 and 5, an OELD device further includes a shielding pattern 252 disposed between a buffer layer 248 and a separator 254. The shielding pattern 252 shields the abnormal light emitted from an organic emitting layer 256 and traveling toward the first substrate (not shown) through the separator 254, which is shown with a dashed arrow of FIG. 5. The shielding pattern 252 may be formed of a light shielding insulating material such as a black resin.

The buffer layer 248 has a first width W1, the shielding pattern 252 has a second width W2, and the separator 254 has a third width W3 at a contacting portion between the separator 254 and the shielding pattern 252. The first width W1 may be greater than the second width W2, and the second width W2 may be greater than the third width W3.

First and second dummy layers 257 and 259 are disposed sequentially on the separator 254. The first dummy layer 257 is formed of the same material as the organic emitting layer 256, and the second dummy layer 259 is formed of the same material as the second electrode 258. The organic emitting layer 256 and the second electrode 258 are formed after forming the separator 254. Accordingly, the first and second dummy layers 257 and 259 are formed on the separator 254 when the organic emitting layer 256 and the second electrode 258 are formed. The OELD device of the second embodiment can be effectively applied to an OELD device having a size under fifteen inches.

Figure 6:
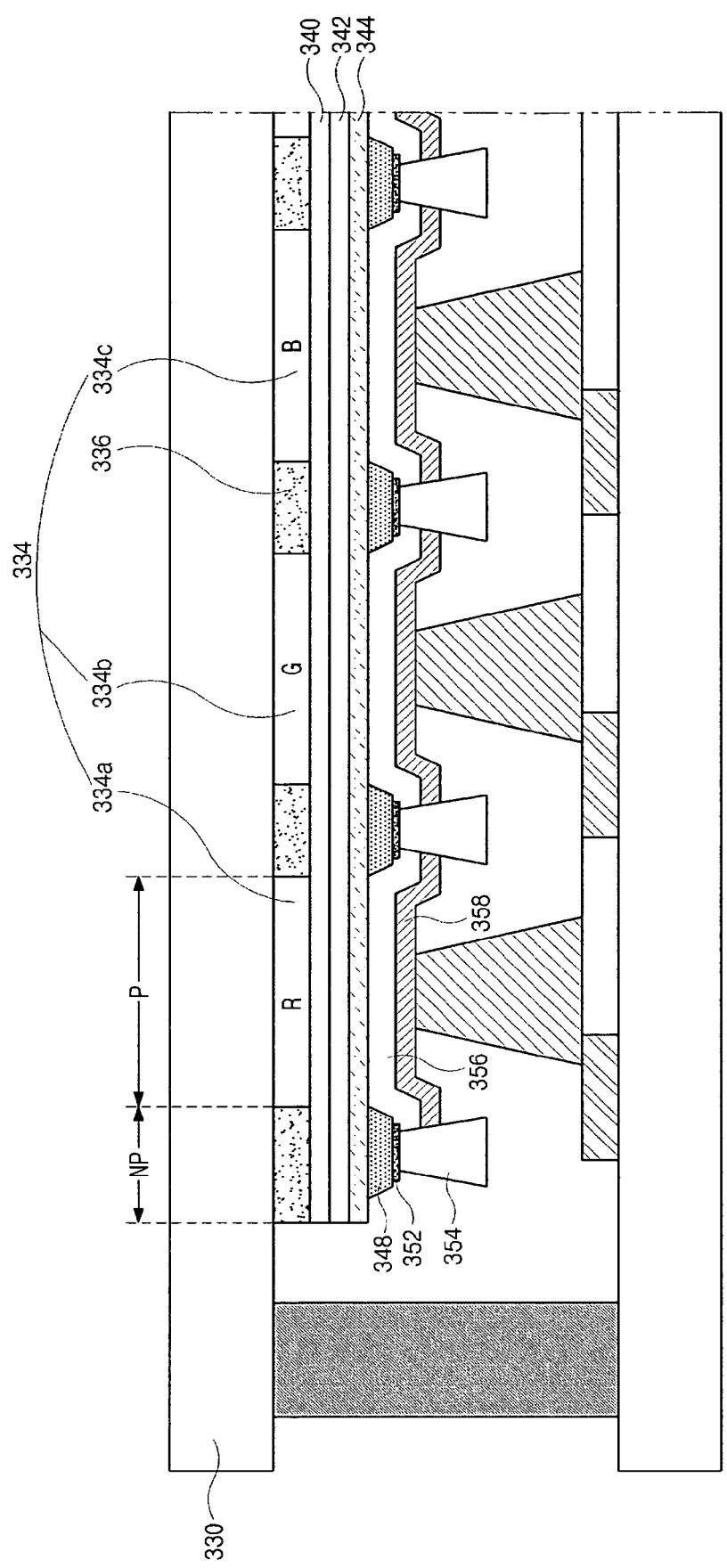
FIG. 6 is a cross-sectional view of an OELD device according to a third embodiment of the present invention.

FIG. 6 is a cross-sectional view of an OELD device according to a third embodiment of the present invention. The third embodiment relates to an OELD device capable of displaying colors. Detailed explanation of the similar parts to the first and second embodiments will be omitted. The OELD device of the third embodiment is similar to that of the second embodiment, except for a color displaying means.

As illustrated in FIG. 6, the OELD device includes a color filter pattern 334 as well as a shielding pattern 352. The color filter pattern 334 as a color displaying means is disposed on a second substrate 330. The color filter pattern 334 may further include red (R), green (G) and blue (B) color filter patterns 334a, 334b and 334c in respective pixel regions P. The red (R), green (G) and blue (B) color filter patterns 334a, 334b and 334c may be formed of red, green and blue color resins, respectively.

A black matrix 336 is disposed in a non-pixel region NP between adjacent pixel regions P. The black matrix 336 may correspond to metal lines such as gate and data lines. A planarization layer 340 and a barrier layer 342 are disposed between the color filter pattern 334 and a first electrode 344. The planarization layer 340 planarizes the second substrate 330 having the color filter patterns 334. The barrier layer 342 prevents the color filter pattern 334 from outgassing and stabilizes elements deposited thereon. The shielding pattern 352 may be disposed between a buffer layer 348 and a separator 354, similarly to that of the second embodiment.

As above explained, the color filter patterns 334 are disposed on the inner surface of the second substrate 330. However, it should be understood that the arrangement of the color filter patterns 334 in the OELD device is not limited to, and that various modifications are feasible according to the principles of the present invention.

In the third embodiment, the OELD device can display color images through the color filter patterns 334. Accordingly, an organic emitting layer 356 may emit a single color, for example, a white color.

In the third embodiment, the OELD device includes the color filter patterns as a color displaying means. However, it should be understood that a color changing medium (CCM) disposed between the second substrate and the color filter patterns can be further used as a color displaying means.

Figure 7:
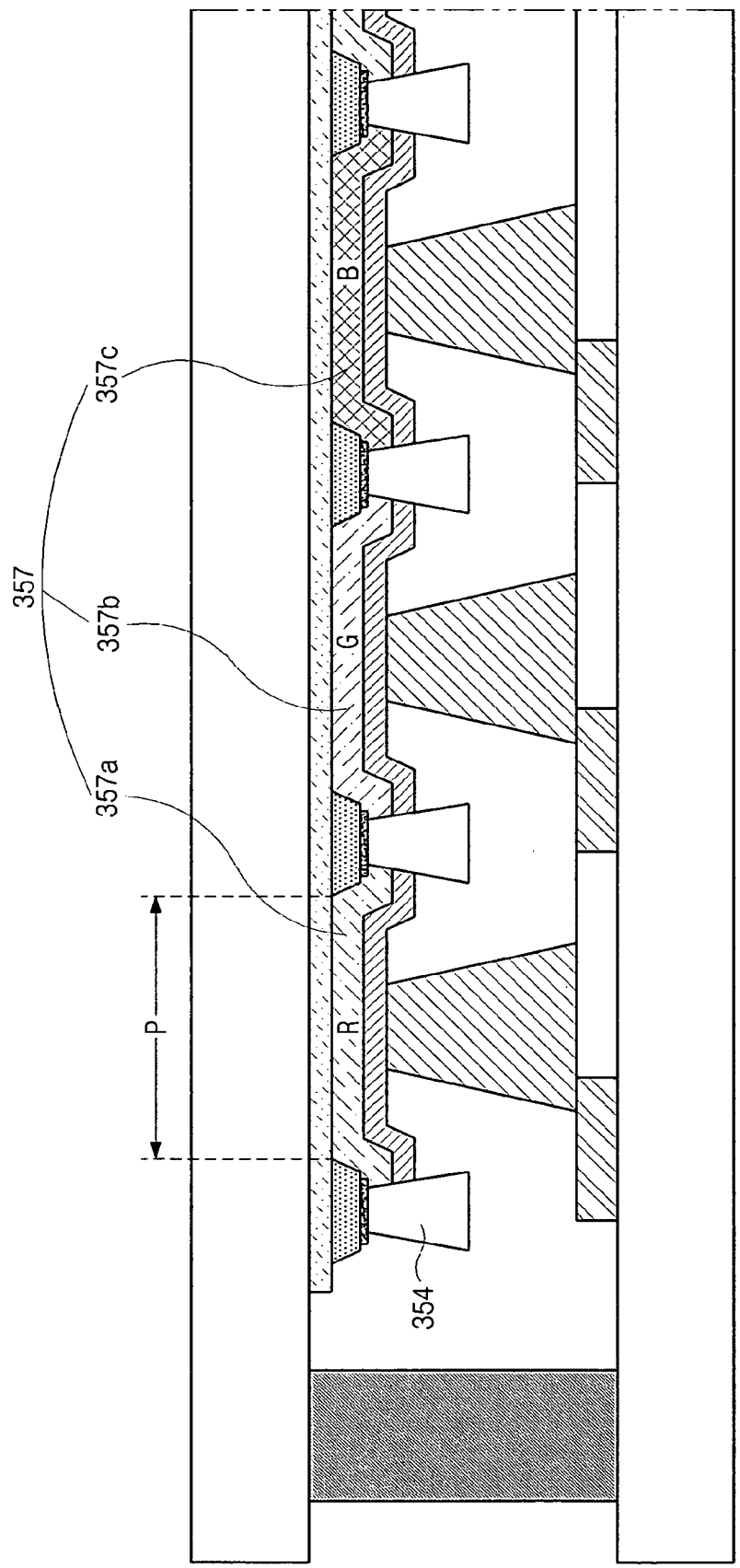
FIG. 7 is a cross-sectional view of an OELD device according to a fourth embodiment of the present invention.

FIG. 7 is a cross-sectional view of an OELD device according to a fourth embodiment of the present invention. The fourth embodiment relates to an OELD device displaying colors as in the third embodiment. Detailed explanation of the similar parts to the first to third embodiments will be omitted.

As illustrated in FIG. 7, the OELD device includes organic emitting layers 357 as a color displaying means including red (R), green (G) and blue (B) emitting layers 357a, 357b and 357c in respective pixel regions P between adjacent separators 354. The red (R), green (G) and blue (B) emitting layers 357a, 357b and 357c are used as a color display means instead of the color filter patterns 334 of the third embodiment.

Figure 8:
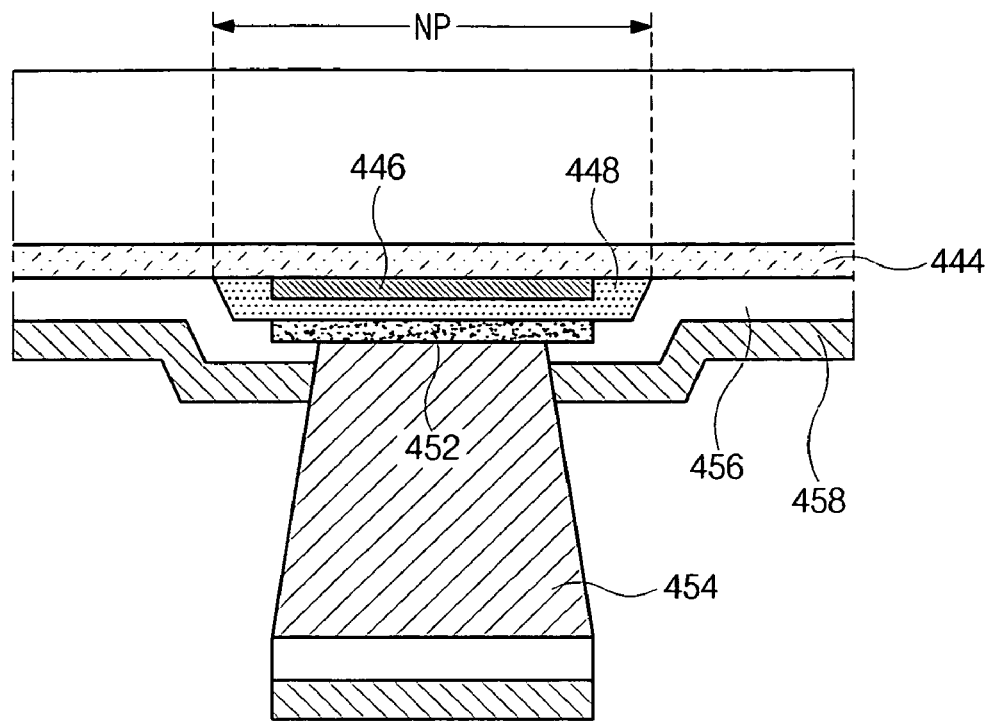
FIG. 8 is a cross-sectional view of an OELD device according to a fifth embodiment of the present invention.

FIG. 8 is a cross-sectional view of an OELD device according to a fifth embodiment of the present invention. Detailed explanation of the similar parts to the first to fourth embodiments will be omitted. The OELD device of the fifth embodiment is similar to that of the second embodiment, except for a resistance reducing means.

As illustrated in FIG. 8, the OELD device includes an auxiliary electrode 446 as a resistance reducing means in a non-pixel region P. The auxiliary electrode 446 contacts a first electrode 444 and is disposed between the first electrode 444 and a buffer layer 448 in a non-pixel region NP. Since the first electrode 444 is formed of a transparent conductive material such as indium-tin-oxide (ITO), the first electrode 444 has a high resistance compared with metal. In particular, when the OELD device has a large size more than fifteen inches, the high resistance of the first electrode 444 causes electrical problems. Accordingly, to reduce the resistance of the first electrode 444, the auxiliary electrode 446 having a resistance lower than the first electrode 444 is used. The auxiliary electrode 446 may be formed of a material that can prevent galvanic corrosion with the first electrode 444. In other words, the auxiliary electrode 446 may not be formed of a material including aluminum (Al), because a material including aluminum may create a galvanic corrosion problem when used in association with the first electrode 444 formed of ITO. Instead, molybdenum (Mo) may be used for the material of the auxiliary electrode 446.

On the buffer layer 448, a shielding pattern 452 and a separator 454 are disposed. Between adjacent separators 454, an organic emitting layer 456 and a second electrode 458 are disposed.

Figure 9:
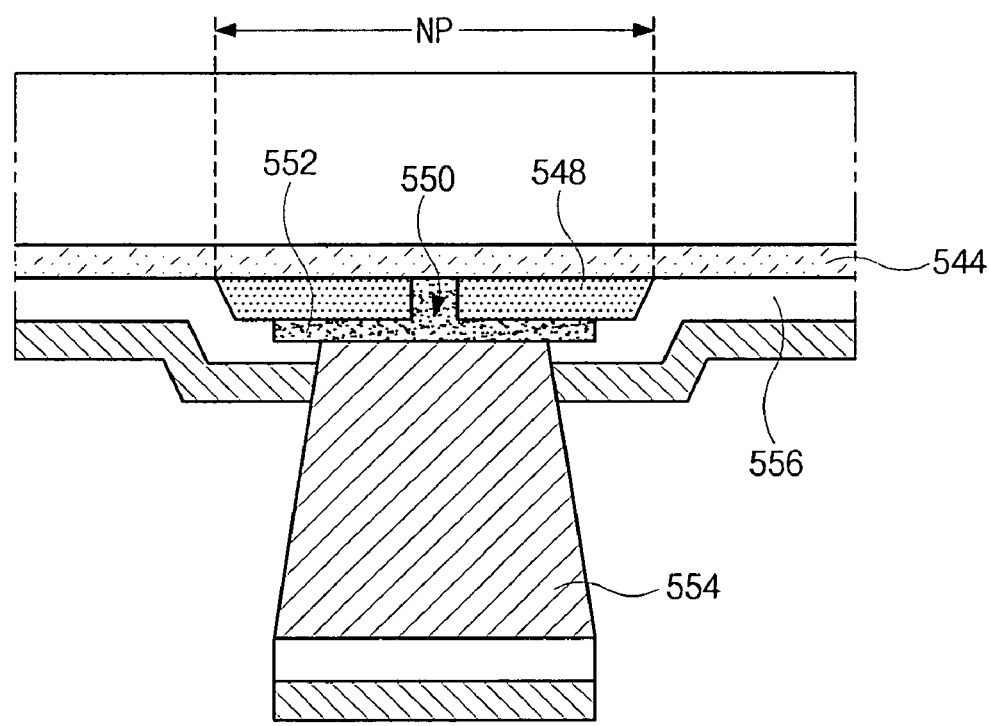
FIG. 9 is a cross-sectional view of an OELD device according to a sixth embodiment of the present invention.

FIG. 9 is a cross-sectional view of an OELD device according to a sixth embodiment of the present invention. Detailed explanation of the similar parts to the first to fifth embodiments will be omitted. The OELD device of the sixth embodiment is similar to that of the fifth embodiment, except for structures of a resistance reducing means and a shielding pattern.

As illustrated in FIG. 9, the OELD device includes a shielding pattern 552 acting as both a light shielding means and a resistance reducing means in a non-pixel region NP. The shielding pattern 552 is disposed between a buffer layer 548 and a separator 554 to shield light, similarly to that of the second embodiment. Furthermore, the shielding pattern 552 having a resistance lower than the first electrode 544 contacts a first electrode 544 to reduce a resistance of the first electrode 544, similarly to the auxiliary electrode of the fifth embodiment.

The buffer layer 548 has a contact hole 550 to contact the shielding pattern 552 and the first electrode 544. Since the shielding pattern 522 acts as a resistance reducing means, the shielding pattern 552 may be formed of a conductive material. In particular, the shielding pattern 552 may be formed of a material that can prevent galvanic corrosion with the first electrode 544, for example, molybdenum (Mo), as explained in the fifth embodiment. Between adjacent separators 554, an organic emitting layer 556 is disposed.

Figure 10:
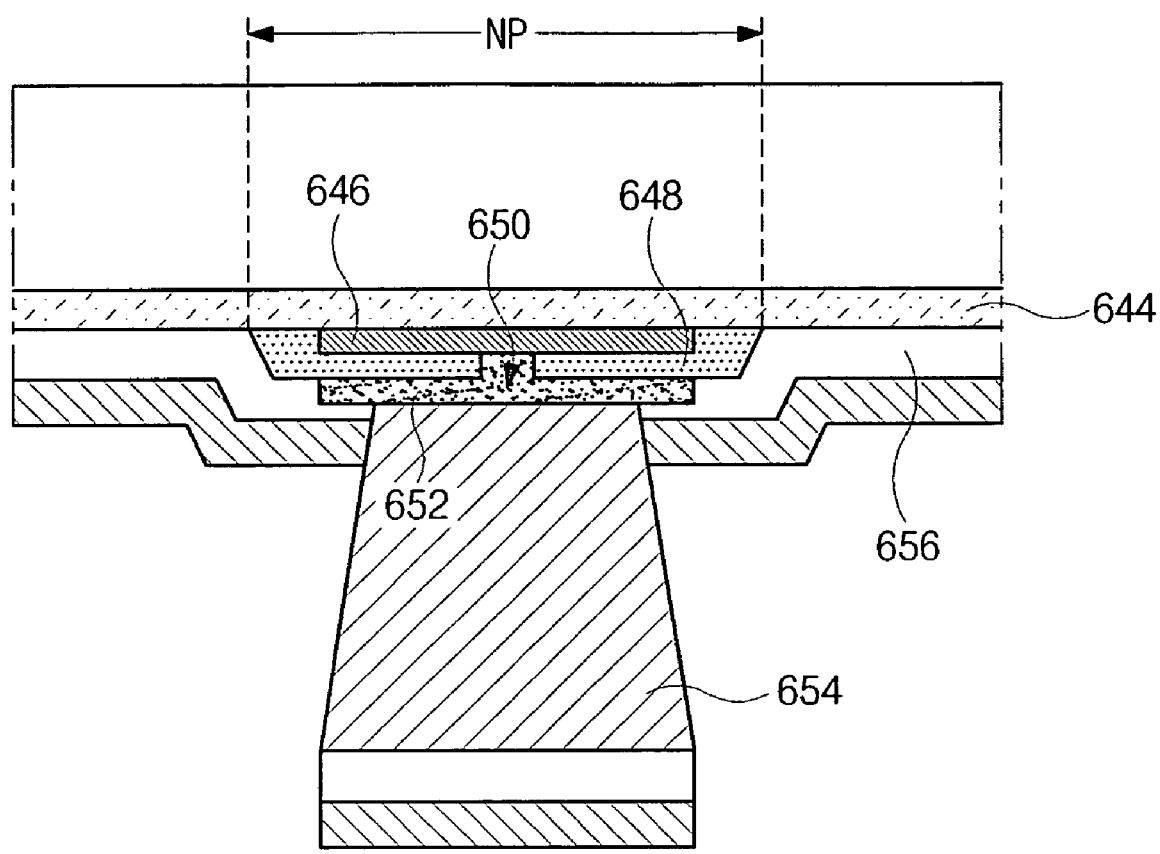
FIG. 10 is a cross-sectional view of an OELD device according to a seventh embodiment of the present invention.

FIG. 10 is a cross-sectional view of an OELD device according to a seventh embodiment of the present invention. Detailed explanation of the similar parts to the first to sixth embodiments will be omitted. The OELD device of the seventh embodiment is similar to that of the fifth and sixth embodiments, except for structures of a resistance reducing means and a shielding pattern.

As illustrated in FIG. 10, the OELD device includes a shielding pattern 652 and an auxiliary electrode 646 contacting each other in a non-pixel region NP. The auxiliary electrode 646 contacts a first electrode 644 and is disposed between the first electrode 644 and a buffer layer 648, similarly to that of the fifth embodiment. Thus, the auxiliary electrode 646 reduces a resistance of the first electrode 644. The shielding pattern 652 is disposed between the buffer layer 648 and a separator 654 to shield light and contacts the auxiliary electrode 646, similarly to that of the sixth embodiment.

The buffer layer 648 has a contact hole 650 to contact the shielding pattern 652 and the auxiliary electrode 646, similarly to that of the sixth embodiment. As explained in the fifth and sixth embodiments, the shielding pattern 652 may be formed of a conductive material that can prevent galvanic corrosion with the first electrode 644, for example, molybdenum (Mo). Between adjacent separators 654, an organic emitting layer 656 is disposed.

Figure 11:
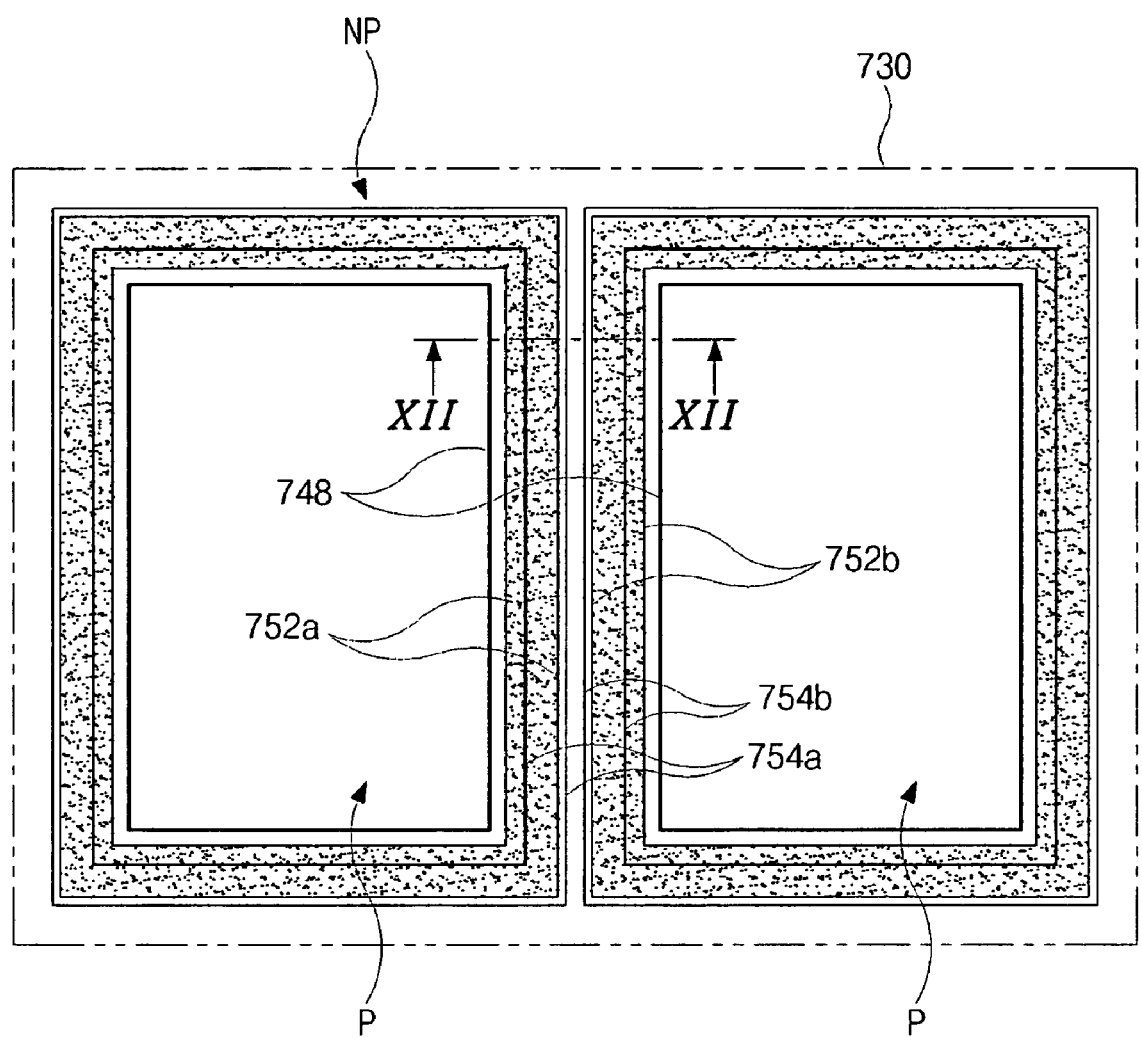
FIG. 11 is a plan view of an OELD device according to an eighth embodiment of the present invention.

FIG. 11 is a plan view of an OELD device according to an eighth embodiment of the present invention, and FIG. 12 is a cross-sectional view taken along a line XII-XII of FIG. 11. Detailed explanation of the similar parts to the first to seventh embodiments will be omitted. The OELD device of the eighth embodiment is similar to that of the second embodiment, except for structures of a shielding pattern and a separator.

As illustrated in FIGS. 11 and 12, the OELD device includes a shielding pattern 752 and a separator 754 having double-patterned structures. In other words, the shielding pattern 752 includes a first pattern 752a and a second pattern 752b on both side portions of a buffer layer 748, and the separator 754 includes a first sub-separator 754a and a second sub-separator 754b on the first pattern 752a and the second pattern 752b, respectively.

Width relations of the buffer layer 748, the shielding pattern 752 and the separator 754 are similar to those of the second embodiment. In other words, a width of a portion of the buffer layer 748 corresponding to the first pattern 752a is greater than that of the first pattern 752a, and the width of the first pattern 752a is greater than that of the first sub-separator 754a at a contacting portion between the first sub-separator 754a and the first pattern 752a. Furthermore, a width of a portion of the buffer layer 748 corresponding to the second pattern 752b is greater than that of the second pattern 752b, and the width of the second pattern 752b is greater than that of the second sub-separator 754b at a contacting portion between the second sub-separator 754b and the second pattern 752b.

In the eighth embodiment, since the separator 754 includes the first and second sub-separators 754a and 754b in a non-pixel region NP, the separator 754 can effectively separate adjacent pixel regions P.

FIGS. 13A to 13E are cross-sectional views of a method of fabricating an OELD device according to the present invention. Although a method of fabricating the OELD device of the second embodiment will be explained, it should be understood that a fabricating method according to the present invention can vary and it can be applied to fabricating methods of the OELD devices of the first embodiment and the third to eighth embodiments with minor variations.

Figure 13A:
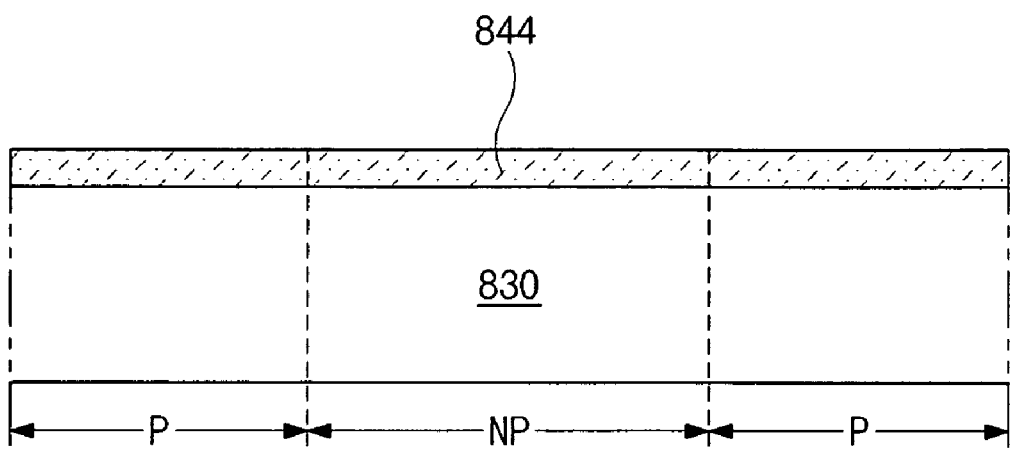
FIGS. 13A to 13E are cross-sectional views of a method of fabricating an OELD device according to the present invention.

As illustrated in FIG. 13A, a first electrode 844 is formed on a substrate 830 having pixel and non-pixel regions P and NP. The first electrode 844 may be formed of a transparent conductive material such as indium-tin-oxide (ITO) and indium-zinc-oxide (IZO).

Figure 13B:
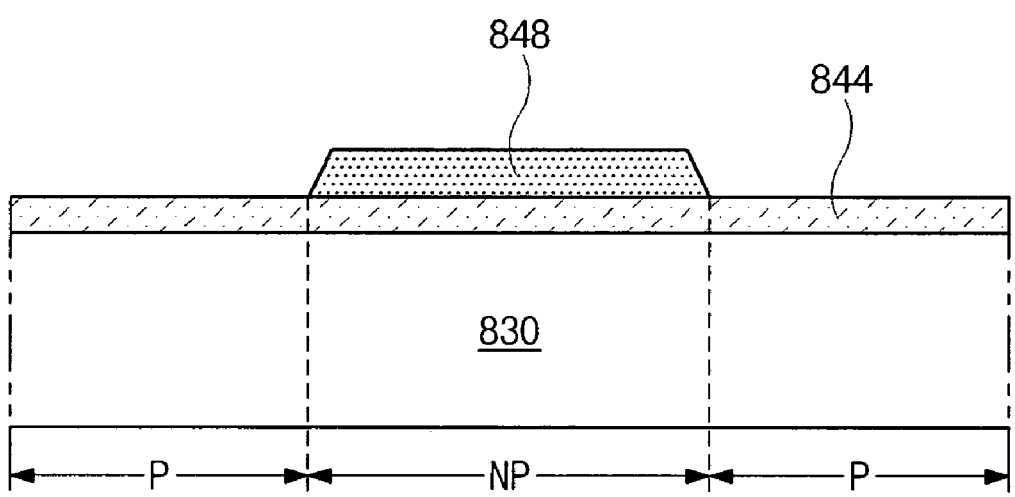

As illustrated in FIG. 13B, a buffer layer 848 is formed on the first electrode 844 in the non-pixel region NP.

Figure 13C:
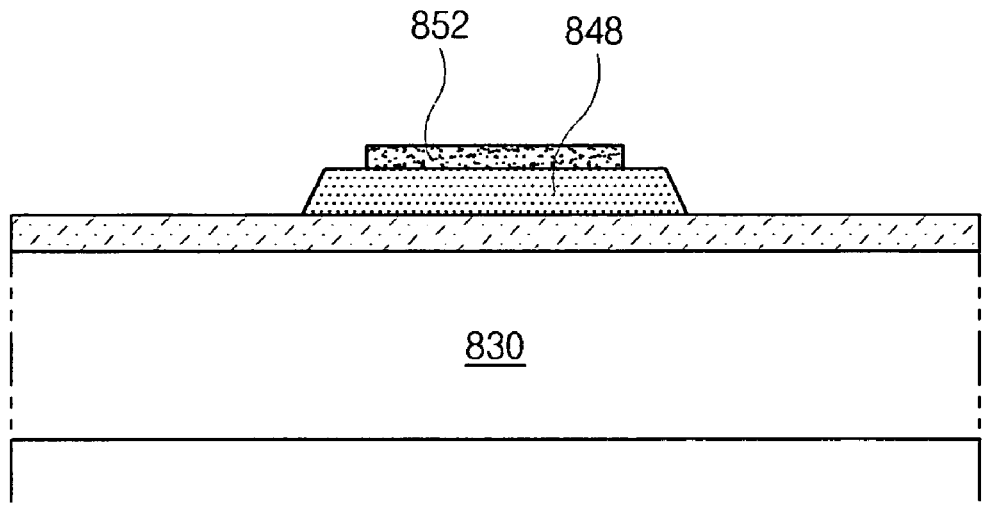

As illustrated in FIG. 13C, a shielding pattern 852 is formed on the buffer layer 848. A width of the buffer layer 848 may be greater than a width of the shielding pattern 852. As explained in the second to eighth embodiments, the shielding pattern 852 may be formed of a light shielding material. In particular, when the OELD device has a large size, the light shielding material can be selected from conductive materials such as metal, especially when the shielding pattern contacts the first electrode or the auxiliary electrode, as shown in FIG. 9 or 10. However, when the shielding pattern does not connected to the first electrode as shown in FIG. 8, the light shielding material may not be a conductor. In such a case, a black resin can also be used for the light shielding material.

Figure 13D:
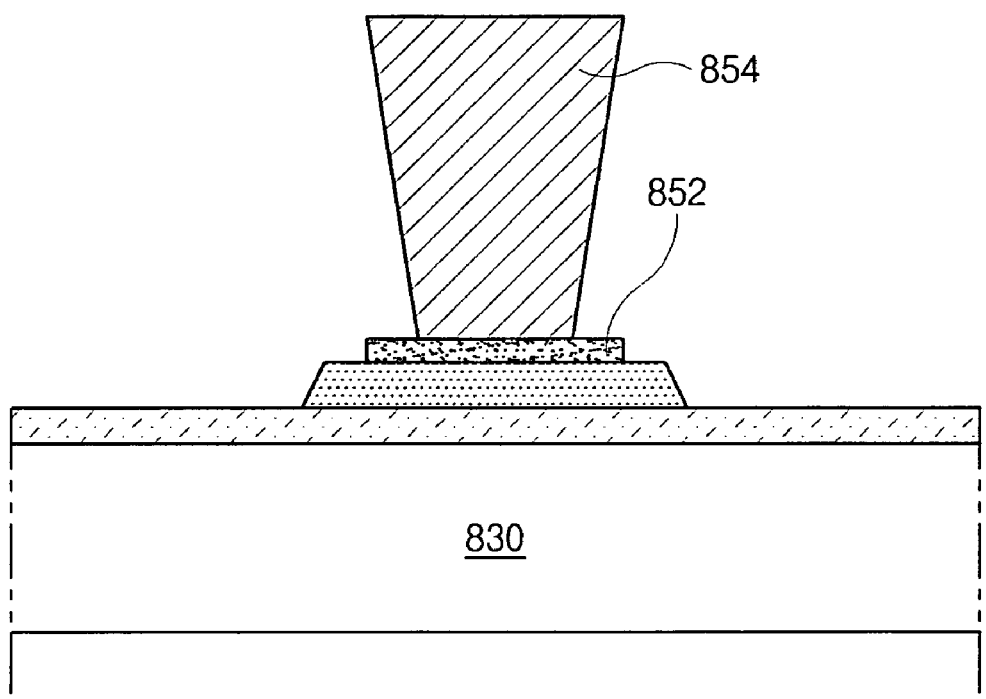

As illustrated in FIG. 13D, a separator 854 is formed on the shielding pattern 852. A width of the shielding pattern 852 may be greater than a width of the separator 854 at a contacting portion between the shielding pattern 852 and the separator 854.

Figure 13E:
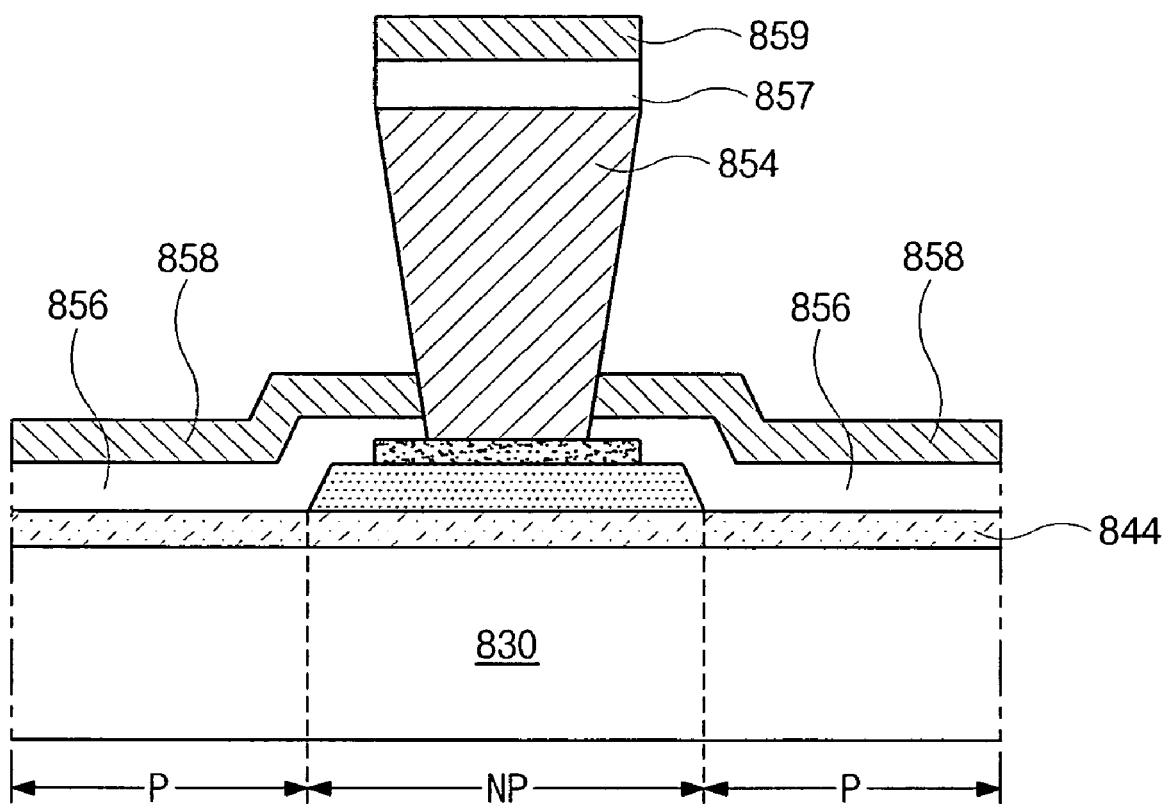

As illustrated in FIG. 13E, first and second dummy layers 857 and 859 are formed on the separator 854, and an organic emitting layer 856 and a second electrode 858 are formed sequentially on the first electrode 844 in the pixel region P.

It will be apparent to those skilled in the art that various modifications and variations can be made in the OELD device and method fabricating an OELD device without departing from the spirit or scope of the invention. Thus, it is intended that the present invention cover the modifications and variations of this invention provided they come within the scope of the appended claims and their equivalents.

What is claimed is:

1. An electroluminescent display device, comprising:
   first and second substrates facing each other and having a pixel region and a non-pixel region;
   a thin film transistor and an array layer on an inner surface of the first substrate;
   a first electrode on an inner surface of the second substrate;
   a buffer layer on an inner surface of the first electrode in the non-pixel region;
   a shielding pattern on an inner surface of the buffer layer;
   a separator on an inner surface of the shielding pattern;
   an emitting layer on the inner surface of the first electrode in the pixel region;
   a second electrode on an inner surface of the emitting layer; and a connection electrode between the first and second substrates, wherein the buffer layer has a contact hole, and the first electrode and the shielding pattern are connected through the contact hole.

2. The device according to claim 1, further comprising an auxiliary electrode between the first electrode and the buffer layer.

3. The device according to claim 1, wherein the shielding pattern has a resistance lower than the first electrode.

4. The device according to claim 1, wherein the first electrode is formed of a transparent conductive material.

5. The device according to claim 1, wherein the shielding pattern is formed of a light shielding material.

6. The device according to claim 1, wherein the shielding pattern is formed of molybdenum.

7. The device according to claim 1, wherein the separator includes first and second sub-separators at both side portions of the non-pixel region.

8. The device according to claim 1, wherein the buffer layer has a width greater than a width of the shielding pattern.

9. The device according to claim 1, wherein the shielding pattern has a width greater than a width of the separator at a contacting portion between the shielding pattern and the separator.

10. The device according to claim 1, wherein the emitting layer includes red, green and blue emitting layers.

11. The device according to claim 2, wherein the buffer layer has a contact hole, and the auxiliary electrode and the shielding pattern are connected through the contact hole.

12. The device according to claim 2, wherein the auxiliary electrode has a resistance lower than the first electrode.

13. The device according to claim 2, wherein the auxiliary electrode is formed of molybdenum.

14. The device according to claim 5, wherein the light shielding material includes black resin.

15. The device according to claim 7, wherein the shielding pattern includes first and second patterns corresponding to the first and second sub-separators.

16. A method of fabricating a substrate for an electroluminescent display device, comprising:
    forming a first electrode on a substrate having a pixel region and a non-pixel region;
    forming a buffer layer on the first electrode in the non-pixel region;
    forming a shielding pattern on the buffer layer;
    forming a separator on the shielding pattern;
    forming an emitting layer on the first electrode in the pixel region; and
    forming a second electrode on the emitting layer,
    wherein forming the buffer layer includes forming a contact hole exposing the first electrode.

17. The method according to claim 16, further comprising forming an auxiliary electrode between the first electrode and the buffer layer.

18. The method according to claim 16, wherein forming the separator includes forming first and second sub-separators at both side portions of the non-display region.

19. The method according to claim 17, wherein forming the buffer layer includes forming a contact hole exposing the auxiliary electrode.

20. The method according to claim 18, wherein forming the shielding pattern includes forming first and second patterns corresponding to the first and second sub-separators.

* * * * *